April 29, 1969 I. WEISSMAN 3,441,881

HIGH Q RADIO FREQUENCY CIRCUITS EMPLOYING A SUPERCONDUCTIVE LAYER ON A THERMALLY MATCHED AGGREGATE METALLIC SUBSTRATE

Filed April 20, 1967

INVENTOR.
IRA WEISSMAN

BY Wm. Nolan
ATTORNEY

United States Patent Office 3,441,881
Patented Apr. 29, 1969

3,441,881

HIGH Q RADIO FREQUENCY CIRCUITS EMPLOYING A SUPERCONDUCTIVE LAYER ON A THERMALLY MATCHED AGGREGATE METALLIC SUBSTRATE

Ira Weissman, Palo Alto, Calif., assignor to Varian Associates, Palo Alto, Calif., a corporation of California Filed Apr. 20, 1967, Ser. No. 632,416
Int. Cl. H01p *1/00;* H01j *25/34, 7/26*
U.S. Cl. 333—99 11 Claims

ABSTRACT OF THE DISCLOSURE

High Q radio frequency circuits such as reference cavity resonators for frequency standards and coupled cavity circuits for linear accelerators are disclosed. Such circuits comprise a radio frequency wave supporting structure formed by a superconductive layer deposited upon or otherwise formed on a metallic substrate member. The substrate is matched to the coefficient of linear thermal expansion of the superconductive layer such that thermally produced strains of the superconductive layer are prevented in fabrication and use. The metallic substrate member is formed of a porous metal structure of a first metal having substantial strength with the pores infiltrated with a second metal having a relatively high thermal conductivity at cyrogenic temperature, as of 1.85° K. Suitable superconductive layers include niobium, niobium-tin, niobium-zirconium, niobium-titanium, tantalum, and vanadium. Suitable aggregate substrate materials include a tungsten or niobium porous metal matrix impregnated with a good thermal conductor such as copper or silver.

In a preferred embodiment, pure niobium is deposited upon a substrate member comprising a porous tungsten matrix impregnated with purified annealed copper with the substrate comprised of about 65% by volume of tungsten and 35% by volume of copper.

The superconductive layer is preferably polished, as by chemical polishing or electropolishing, to remove surface irregularities greater than 1 micron in size. X-band linear accelerator cavities constructed according to the present invention provide Qs of the order of $10^8$ to $10^9$.

*Description of the prior art*

Heretofore, niobium has been deposited upon a niobium substrate to form a superconductive high Q microwave cavity resonator. However, the niobium substrate has relatively poor thermal conductivity at cryogenic temperatures, as of 1.85° K. and, thus, prevents proper cooling of the microwave supportive surfaces in use. In an attempt to remedy the cooling problem, the niobium superconductive layer was deposited upon pure cold worked copper. While the copper provided sufficient strength and thermal conductivity at cryogenic temperatures, its coefficient of linear thermal expansion differed substantially from that of the niobium superconductive layer. As a result, the niobium was rather severely strained, when cooled from deposition temperature to cryogenic temperatures, thereby substantially degrading the Q of microwave circuits formed in this manner.

*Summary of the present invention*

The principal object of the present invention is the provision of an improved superconductive radio frequency circuit and apparatus using same.

One feature of the present invention is the provision, in a radio frequency apparatus, of a high Q radio frequency wave supportive structure formed by a layer of superconductive material, for carrying the radio frequency currents, disposed on a metallic substrate formed of a porous metallic structure of a first metal with the pores of the structure infiltrated with a second metal and the coefficient of linear thermal expansion of the substrate being approximately equal to that of the superconductive layer, whereby thermally produced strains in the superconductive layer are eliminated in fabrication and use.

Another feature of the present invention is the same as the preceding feature wherein the first metal of the substrate is selected from the class consisting of tungsten and niobium and the second metal of the substrate is selected from the class consisting of copper and silver, whereby the substrate has substantial strength and high thermal conductivity at cryogenic temperatures.

Another feature of the present invention is the same as any one or more of the preceding features wherein the second metal of the substrate which is infiltrated into the pores of the substrate is pure annealed copper, whereby the substrate has high thermal conductivity at cryogenic temperatures.

Another feature of the present invention is the same as any one or more of the preceding features wherein the superconductive layer is between 5 microns and 10 mils thick and is selected from the class consisting of niobium, $Nb_3Sn$, NbTi, NbZr, tantalum and vanadium.

Another feature of the present invention is the same as any one or more of the preceding wherein the surface of the superconductive layer is polished to remove substantially all surface irregularities in excess of 1 micron in size.

Another feature of the present invention is the same as any one or more of the preceding features wherein the radio frequency apparatus is a linear particle accelerator or frequency standard.

Other features and advantages of the present invention will become apparent upon a perusal of the following specification taken in connection with the accompanying drawings wherein:

*Description of the preferred embodiments*

Figure 1:
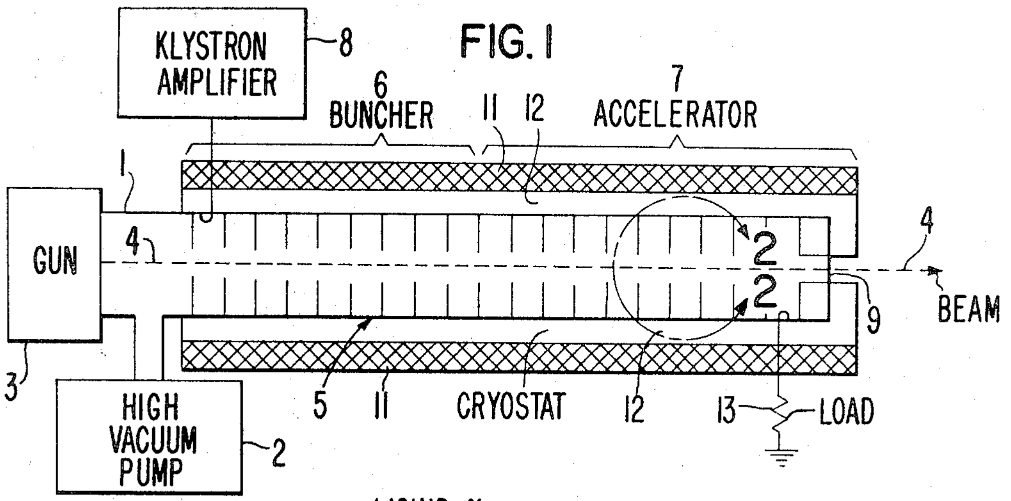
FIG. 1 is a schematic diagram, partly in section and partly in block diagram form, of a linear particle accelerator employing features of the present invention.
Figure 2:
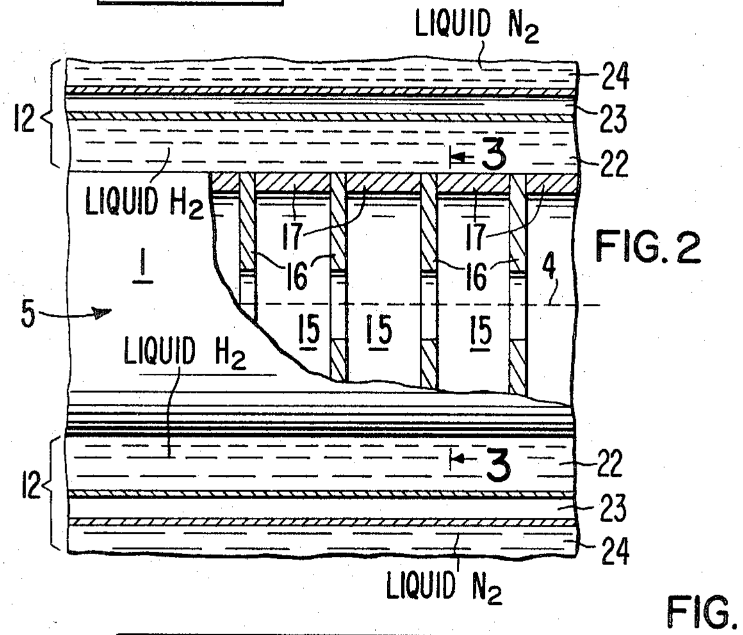
FIG. 2 is an enlarged view, partly in section, of a portion of the structure of FIG. 1 delineated by line 2—2.
Figure 3:
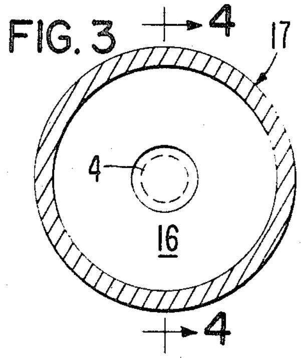
FIG. 3 is a sectional view of a portion of the structure of FIG. 2 taken along line 3—3 in the direction of the arrows.

Referring now to FIG. 1, there is shown a microwave linear particle accelerator incorporating features of the present invention. The particle accelerator comprises an elongated vacuum envelope 1 evacuated to a low pressure, as of 10–8 torr, via a high vacuum pump 2. An electron gun assembly 3 is disposed at one end of the envelope 1 for forming and projecting a beam of electrons 4 axially of the envelope 1 into a radio frequency accelerator structure.

The accelerator structure includes a disk loaded waveguide 5 separated into two successive sections, a buncher section 6 and an accelerating section 7. The disk loaded waveguide 5 is excited with radio frequency wave energy, at for example 10 cm. wavelength, obtained from the output of a klystron amplifier 8. Within the buncher section 6, the electron beam is accelerated and bunched into packets of electrons. These packets of electrons are further accelerated in the accelerator section 7 to nearly the velocity of light. The high velocity electrons exit from the envelope 1 by being driven through a thin foil 9, as of aluminum, at the end of the accelerator.

An electrical solenoid 11 surrounds the disk loaded waveguide 5 for focusing the electron beam therethrough. A cryostat 12 is disposed surrounding the disk loaded waveguide 5 between the solenoid 11 and the waveguide 5. The cryostat is more fully described below and serves to cool the disk loaded waveguide to cryogenic temperatures as of, for example, 1.85° K. Remanent R.F. power, reaching the terminal end of the accelerator section 7, is coupled out of the disk loaded waveguide to a lossy termination 13.

Referring now to FIGS. 2–5, the disk loaded waveguide 5 comprises a plurality of coupled cavity resonators 15 defined by spaces between successive centrally apertured disks 16 which are disposed transversely of a cylindrical waveguide 17.

Figure 4:
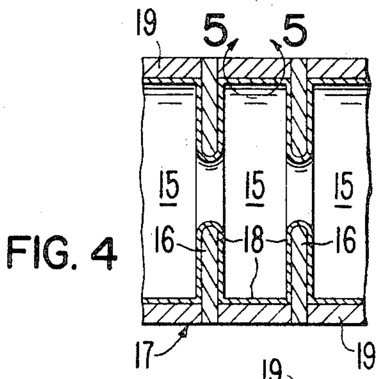
FIG. 4 is an enlarged sectional view of one of the cavity resonators taken along line 4—4 of FIG. 3 in the direction of the arrows.

The interior wall surfaces of the disk loaded waveguide 5 are formed by a layer of superconductive material 18 (see FIG. 4). The layer 18, as of 5 microns to 10 mils thick, is disposed on a substrate structure 19 which serves to support the superconductive layer and to provide a good thermally conductive path between the cryogenic fluid, such as liquid helium at 1.85° K., and the superconductive layer 18. In this manner, the superconductive layer 18 is maintained at or near the temperature of the cryogenic liquid.

The substrate structure 19 is formed of an aggregate material comprising a porous metal matrix of a first metal having substantial strength with the pores of the metal matrix being infiltrated with a second metal having substantial thermal conductivity at cryogenic temperatures. Also, the constituents of the substrate structure 19 are proportioned and chosen such that the substrate material has approximately the same coefficient of linear thermal expansion as that of the superconductive layer 18 over the temperature range of interest. This prevents unwanted strain from being produced in the superconductive layer 18 which would otherwise adversely affect the Q of the coupled cavity radio frequency structure. The temperature range of interest extends from the temperature at which the superconductive layer is formed on the substrate to the operating temperature of 1.85° K. "Approximately the same coefficient of linear thermal expansion over the temperature range of interest" is defined herein to mean, within plus or minus 20%. The coefficients of thermal expansion, however, should be as close as possible and ideally should be exactly the same.

Suitable superconductive layers 18 are selected from the class of materials consisting of niobium, $Nb_3Sn$, NbZr, tantalum, and vanadium. A preferred material is pure niobium. The superconductive layer 18 is preferably polished, as by eletcropolishing or chemical polishing, to provide a surface finish which is characterized by having substantially no surface irregularities greater than 1 micron in size.

The superconductive layer 18 may be formed on the substrate structure 19 by any one of a number of conventional methods such as chemical vapor deposition, evaporation, or by electrodeposition.

Suitable aggregate substrate materials comprise a porous metal structure made of a first metal having substantial strength and selected from the class consisting of niobium and tungsten. The pores of the metal structure are infiltrated with a second metal having substantial thermal conductivity at cryogenic temperatures and selected from the class consisting of silver and copper. In a preferred embodiment, the second metal of the substrate 19, which provides thermal conductivity and which fills the pores of the first metal, is pure annealed copper. Such copper which is 99.999% pure has a thermal conductivity at temperatures below 20° K. of about 5 to 10 times the thermal conductivity of 99.999% pure copper which has been cold worked or 99.9+% pure electrolytic touch pitch copper.

In a preferred embodiment, the superconductive layer 18 is niobium and the substrate 19 is between 60% and 75% by volume of tungsten with the pores of the tungsten infiltrated with copper. For example, niobium has a coefficient of linear thermal expansion of about $7.5\times10^{-6}$ inches per inch per degree centigrade over the temperature range of room temperature to 900° C. A matrix formed by 65% by volume of tungsten infiltrated with copper has an average coefficient of linear thermal expansion of about $7.5\times10^{-6}$ inches per inch per degree centigrade from room temperature to 900° C. and, thus, is well matched to niobium. Pure niobium is chemically vapor deposited on the substrate 19 at 900° C. and, when cooled to cryogenic temperatures of 1.85° K., provides a substantially unstrained superconductive layer 18.

Cavities 15, employing the unstrained superconductive niobium layer 18, provide a cavity Q on the order of $10^8$ at X-band. Such a high Q permits the radio frequency electric fields of the disk loaded waveguide 5 to be raised to a very high duty cycle without overheating the disk loaded structure. Such a high duty cycle permits higher average output beam currents.

The cryostat 12, which surrounds the disk loaded waveguide 5, comprises a central cylindrical chamber 22 containing the disk loaded waveguide 5 and is filled with liquid helium at reduced pressure, as of 20 torr. An annular evacuated chamber 23 surrounds the helium chamber 22 and an annular liquid nitrogen filled chamber 24 surrounds the evacuated chamber 23.

Figure 6:
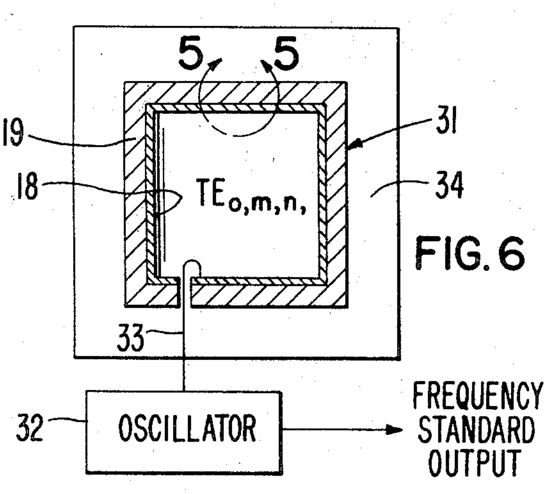
FIG. 6 is a schematic view, partly in section and partly in block diagram form, of a frequency standard employing features of the present invention.

Referring now to FIG. 6, there is shown a frequency standard employing a high Q superconductive cavity resonator 31 incorporating features of the present invention. The cavity resonator 31 forms a reference cavity for controlling the frequency of an oscillator 32 coupled to the cavity 31 via a transmission line 33. An output of the oscillator 32 serves as the frequency standard output. A cryostat 34 surrounds the cavity for maintaining the cavity 31 at a cryogenic temperature, as of 1.85° K.

Figure 5:
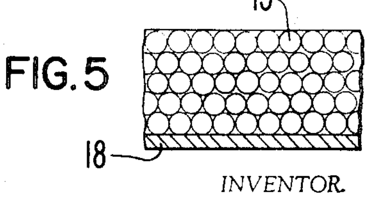
FIG. 5 is an enlarged view of a portion of the structure of FIGS. 4 and 6 delineated by line 5—5.

The cavity resonator 31 is a cylindrical resonator dimensioned for operation on one of the higher order high Q circular electric modes such as, for example, a $TE_{o,m,n}$ mode, where *o* is zero, *m* is one or more and *n* is 4 or more. The cavity 31, as shown in FIG. 5, has a superconductive layer 18 disposed on a thermally matched aggregate substrate 19 as previously described herein.

Since many changes could be made in the above construction and many apparently widely different embodiments of this invention can be made without departing from the scope thereof it is intended that all matter contained in the above description or shown in the accompanying drawings shall be interpreted as illustrative and not in a limiting sense.

What is claimed is:

1. In a radio frequency apparatus, means forming a radio frequency wave supportive structure, said wave supportive structure including a substrate member and a superconductive radio frequency wave supportive layer disposed thereon, the improvement wherein, said substrate member comprises a porous metallic member made of a first metal with its pores infiltrated with a second metal, and said substrate member having an average coefficient of linear thermal expansion which is within 20% of that of said superconductive wave supportive layer from room temperature to cryogenic temperatures.

2. The apparatus of claim 1 wherein said superconductive wave supportive layer has a characteristic thickness falling within the range of 5 microns to 10 mils.

3. The apparatus of claim 1 wherein said superconductive layer is selected from the class consisting of niobium, NbTi, $Nb_3Sn$, NbZr, tantalum, and vanadium.

4. The apparatus of claim 1 wherein said first metal of said substrate member is selected from the class consisting of tungsten and niobium, and said second metal of said substrate member is selected from the class consisting of silver and copper.

5. The apparatus of claim 4 wherein said second metal of said substrate member is annealed copper at least 99.98% pure.

6. The apparatus of claim 1 wherein said first metal of said substrate is tungsten and comprises between 60% and 75% by volume of said substrate member.

7. The apparatus of claim 1 wherein the surface of said superconductive layer is characterized by a surface finish which is substantially free of surface irregularities greater than 1 micron in size.

8. The apparatus of claim 6 wherein said superconductive wave supportive layer is made of pure niobium.

9. The apparatus of claim 1 wherein the radio frequency apparatus is a microwave linear particle accelerator.

10. The apparatus of claim 1 wherein the radio frequency apparatus is a frequency standard.

11. The apparatus of claim 1 wherein said second metal has a thermal conductivity greater than that of said superconductive layer.

No references cited.

HERMAN KARL SAALBACH, *Primary Examiner.*

L. ALLAHUT, *Assistant Examiner.*

U.S. Cl. X.R.

313—36; 174—15; 333—31; 315—3.5